US009279978B2

(12) United States Patent
Kim et al.

(10) Patent No.: US 9,279,978 B2
(45) Date of Patent: Mar. 8, 2016

(54) OPTICAL MODULE FOR LASER BEAM SHAKING

(71) Applicant: Samsung Display Co., Ltd., Yongin, Gyeonggi-Do (KR)

(72) Inventors: Sung-Gon Kim, Yongin (KR); Je-Kil Ryu, Yongin (KR); Gyoo-Wan Han, Yongin (KR); Hae-Sook Lee, Yongin (KR); Tae-Yong Kim, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 194 days.

(21) Appl. No.: 14/190,661

(22) Filed: Feb. 26, 2014

(65) Prior Publication Data

US 2014/0268265 A1    Sep. 18, 2014

(30) Foreign Application Priority Data

Mar. 18, 2013  (KR) ........................ 10-2013-0028805

(51) Int. Cl.
*G02B 26/08* (2006.01)
*G02B 7/182* (2006.01)
*H01S 5/00* (2006.01)

(52) U.S. Cl.
CPC .......... *G02B 26/0816* (2013.01); *G02B 7/1825* (2013.01); *H01S 5/0071* (2013.01)

(58) Field of Classification Search
CPC ........... G02B 26/0816; G02B 26/0841; G02B 26/0858; G02B 26/105; G02B 27/646; H01L 41/04; H01L 41/0805; H01L 41/09; H01L 41/0933; H01L 41/0986; H01L 27/20

USPC .......... 359/198.1–199.1, 199.4, 200.1, 200.8, 359/221.2, 223.1–226.2; 310/328, 367
See application file for complete search history.

(56) References Cited

U.S. PATENT DOCUMENTS

| 7,417,358 B2* | 8/2008 | Sugahara ............... B65H 5/008 310/328 |
| 7,723,169 B2 | 5/2010 | Graefe et al. |
| 2010/0246041 A1* | 9/2010 | Kim ................... G02B 26/0816 359/877 |

FOREIGN PATENT DOCUMENTS

| JP | 08-110309 A | 4/1996 |
| JP | 08-149077 A | 6/1996 |
| JP | 2007-155984 A | 6/2007 |

* cited by examiner

*Primary Examiner* — James Phan
(74) *Attorney, Agent, or Firm* — Knobbe Martens Olson & Bear LLP; Mincheol Kim

(57) ABSTRACT

Apparatus for uniformizing light amount distribution by shaking line beams along a longitudinal axis direction is provided. The apparatus includes a mirror mount, a mirror, an actuator, and a deformation member. The mirror fixed to the mirror mount and includes a reflective surface. The actuator is disposed at a distance from the mirror mount and configured to repeat expansion and contraction along a first direction. The deformation member includes a plurality of blocks connected to each other by flexible joints and is coupled to the actuator and the mirror mount. The deformation member is configured to change a displacement in the first direction due to operation of the actuator to a displacement in a second direction that crosses the first direction, amplify the changed displacement, and transmit the amplified displacement to the mirror mount.

16 Claims, 9 Drawing Sheets

OPTICAL MODULE FOR LASER BEAM SHAKING

RELATED APPLICATIONS

This application claims priority to and the benefit of Korean Patent Application No. 10-2013-0028805 filed in the Korean Intellectual Property Office on Mar. 18, 2013, the entire contents of which are incorporated herein by reference.

BACKGROUND

1. Field

The described technology relates generally to an optical module for laser beam shaking.

2. Discussion of the Related Technology

A laser is utilized for various usages in various industries. For example, polysilicon used in a thin film transistor of an organic light emitting diode (OLED) display may be formed by crystallizing amorphous silicon through an annealing method using a laser. In addition, the laser is used in a laser beam printer, a scanner, or a projection-type display device.

A laser light source and a line-shaped laser beam (hereinafter, referred to as a line beam) generated by an optical system have light amount distribution that is non-uniform within a given range. Therefore, a mirror in the optical system is vibrated to shake the line beam along a longitudinal axis for uniform light amount distribution.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an optical module for laser beam shaking. The optical module according to an aspect of the present invention can increase the maximum amplitude of a mirror, easily modify a natural frequency, and easily modify an operation characteristic thereof according to the purpose of application and performance requirements.

An optical module for laser beam shaking according to an exemplary embodiment includes a mirror mount, a mirror, an actuator, and a deformation member. The mirror is fixed to the mirror mount and includes a reflective surface configured to reflect a laser beam. The actuator is disposed at a distance from an end of the mirror mount and configured to repeat expansion and contraction along a first direction. The deformation member includes a plurality of blocks connected to each other by flexible joints, and is coupled to the actuator and the mirror mount. The deformation member is configured to change a displacement in the first direction due to operation of the actuator to a displacement in a second direction that crosses the first direction, configured to amplify the changed displacement, and further configured to transmit the amplified displacement to the mirror mount.

The reflective surface has a rectangular shape and is configured to reflect a line beam, and a length direction of the reflective surface may match a longitudinal axis direction of the line beam. The first direction may be generally perpendicular to the ground and the second direction may be generally perpendicular to the reflective surface.

The optical module may include a pivot member coupled to the mirror mount and configured to function as a hinge and a support member disposed in a rear side of the mirror mount and coupled to the pivot member. The plurality of blocks may include: first and second blocks opposing each other and arranged along the first direction; third and fourth blocks opposing each other and arranged along the second direction; and a plurality of connection blocks connecting the first to fourth blocks.

Each of the flexible joints may have a thickness smaller than that of each of the plurality of blocks. The deformation member may include at least one of stainless steel and aluminum, and lateral side surfaces of the flexible joints may have a semi-circular shape.

The actuator may include a fixed portion fixed to the first block and a working portion fixed to the second block and configured to repeatedly move back and forth with respect to the fixed portion. The third block is fixed to the support member, the fourth block is fixed to one end of the mirror mount, and wherein the deformation member is configured such that a distance between the fourth block and the third block may be changed when the flexible joint is bent along movement of the second block.

The third block and the fourth block may be formed larger than the first block and the second block in length so that a displacement of the fourth block may become greater than a displacement of the second block.

The pivot member may be a hinge member. The hinge member may include a first part fixed to the support member, a second part fixed to the mirror mount, and a flexible joint integrally connecting the first part and the second part.

The thickness of the flexible joint of the hinge member is smaller than the first part and the second part, and the hinge member is configured such that, when the flexible joint of the hinge member is bent, the second part may rotate to support rotation of the mirror mount. The hinge member may include at least one of stainless steel and aluminum, and the flexible joint of the hinge member may include lateral side surfaces having a semi-circular shape.

Alternatively, the pivot member may include at least one rotation shaft fixed to the mirror mount and at least one roller bearing configured to support the rotation shaft.

The optical module may further include a housing having a top cover opposing a top surface of the mirror mount and a bottom portion opposing a bottom surface of the mirror mount. The at least one rotation shaft includes a pair of shafts respectively disposed in the top surface and the bottom surface of the mirror mount, and the at least one roller bearing includes bearings provided in the top cover and the bottom portion. The roller bearing may be formed as an outer-ring rotation type cross roller ring.

DETAILED DESCRIPTION

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the specification and claims, unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In one example of an optical module for shaking the line beam, the module includes a mirror, a support structure supporting the mirror, and an actuator vibrating one end of the mirror in frontward and backward directions. In this example, a spring may be provided between the opposite end of the mirror and the support structure.

As the line beam is large-scaled, performance for uniformizing light amount distribution can be improved by increasing a driving frequency and amplitude. Operation characteristics of the optical module are determined by the actuator and the spring, but the characteristics cannot be easily changed and the optical module has a performance limit. For example, the driving frequency should be lower than a natural frequency of the optical module. However, the natural frequency of the optical module in accordance with the foregoing example cannot be easily modified. Further, the maximum amplitude of the mirror, determined by the actuator cannot exceed a predetermined limit, for example, about 100 μm.

Figure 1:
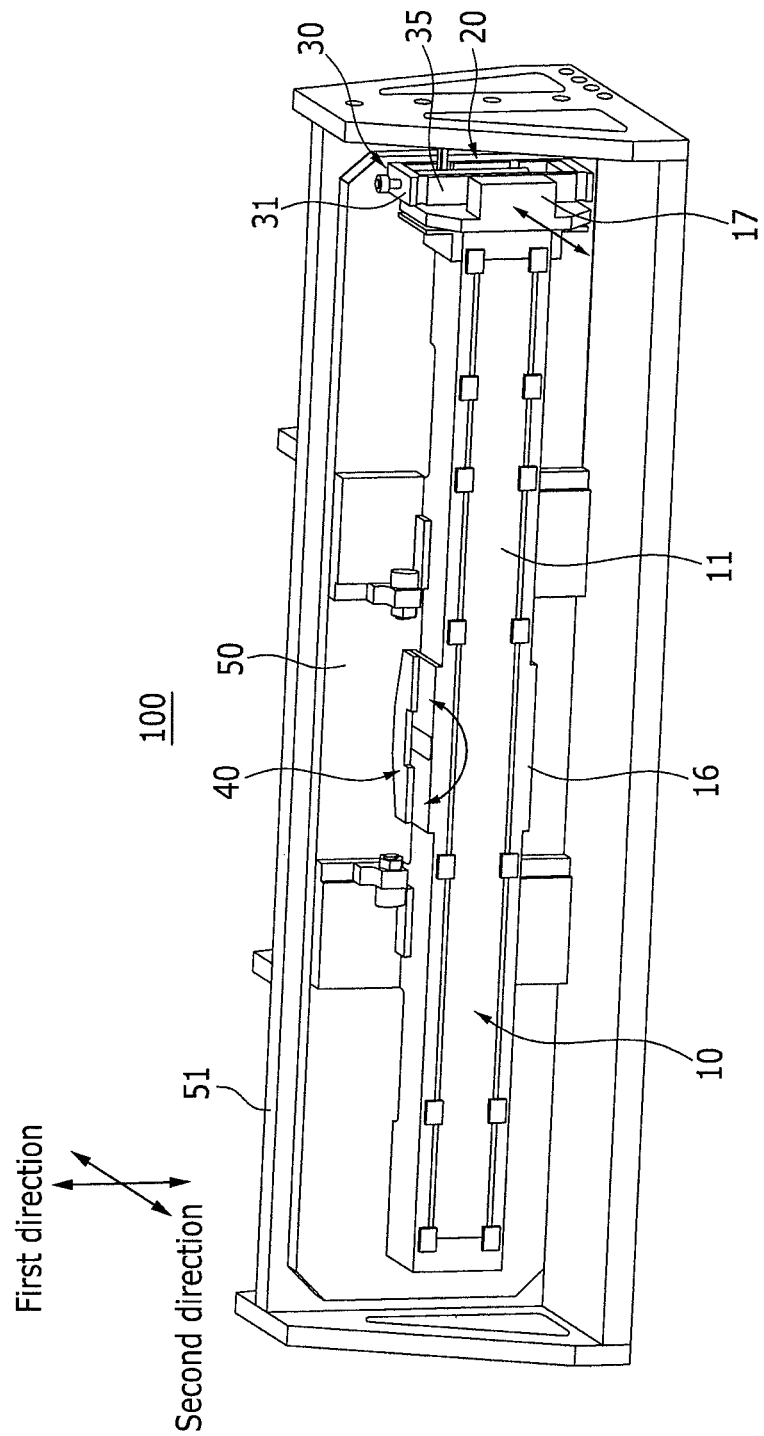
FIG. 1 is a perspective view of an optical module according to a first exemplary embodiment.
Figure 2:
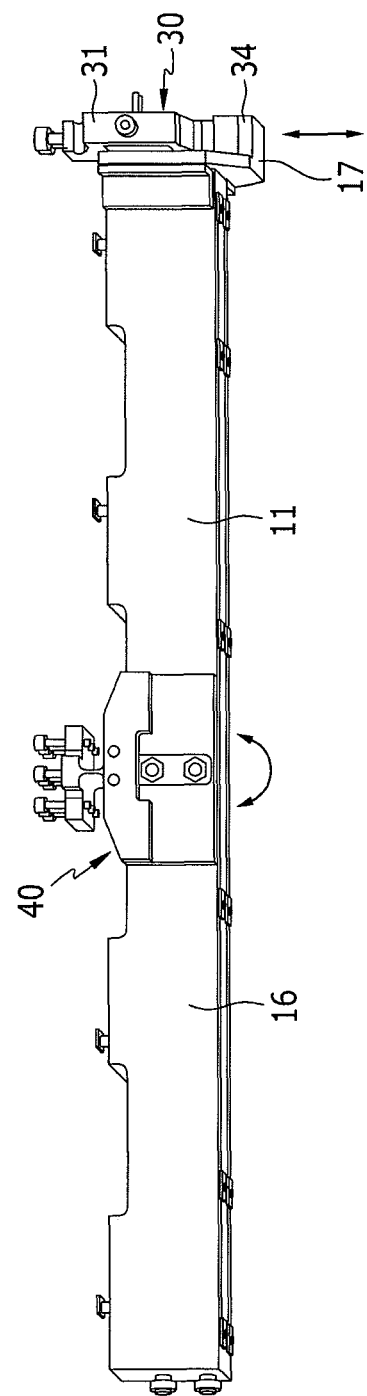
FIG. 2 is a top plan view of a part of the optical module of FIG. 1.

FIG. 1 is a perspective view of an optical module according to a first exemplary embodiment and FIG. 2 is a top plan view partially illustrating the optical module of FIG. 1.

An optical module 100 according to the first exemplary embodiment is provided in an optical system that transmits laser beams generated from a laser source to a substrate, and includes a mirror 10 reflecting the laser beam and mechanical devices shaking the laser beam by vibrating the mirror 10. The optical module 100 may be used for uniformizing light amount distribution of line-shaped laser beams (hereinafter, referred to as line beams).

Figure 3:
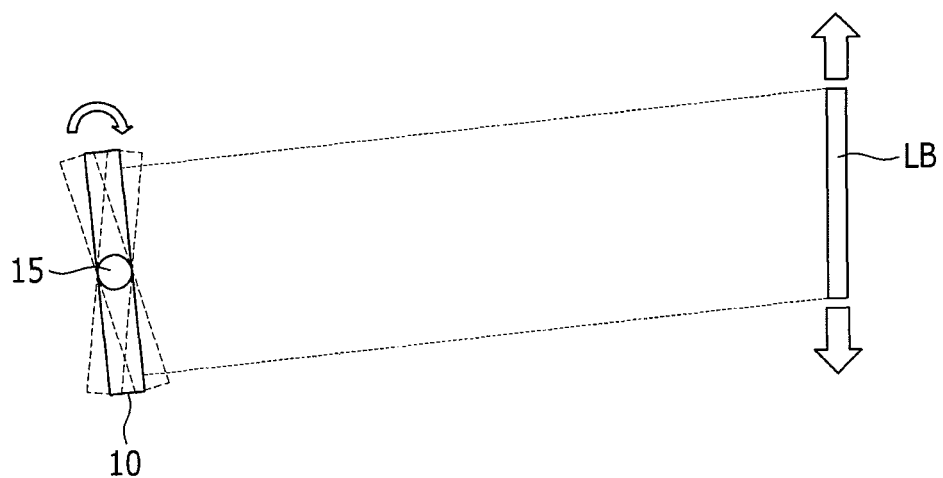
FIG. 3 is a schematic diagram for description of operation of the optical module of FIG. 1.
Figure 4:
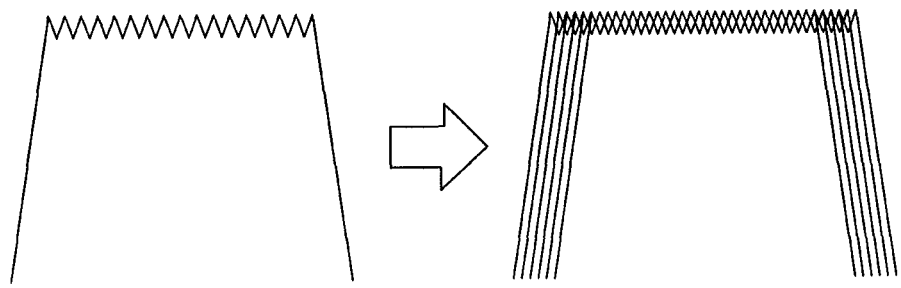
FIG. 4 is a schematic diagram illustrating intensity of light according to a longitudinal axis direction of line beam.

FIG. 3 is a schematic diagram provided for description of operation of the optical module and FIG. 4 is a schematic diagram of light intensity according to a longitudinal axis direction of the line beam. In one embodiment, the longitudinal axis direction is perpendicular to the first and second directions.

Referring to FIG. 3 and FIG. 4, lateral ends of the mirror 10 vibrate or repeat a partial rotation within a predetermined range with respect to a pivot member or hinge member 15. Thus, a line beam LB reflected by the mirror 10 is shaken along the longitudinal axis direction, and accordingly, the distribution of light amount of the line beam LB is uniformized along the longitudinal axis direction.

In the above-stated process, the light amount distribution of the line beam LB is further effectively uniformized as amplitude at the ends of the mirror 10 and a driving frequency are increased. Thus, the apparatus 100 in accordance with the invention can reduce or remove inhomogeneity of the light intensity of a line-shaped laser beam, and can make the light intensity of a line-shaped laser beam homogeneous. Further, an operation characteristic of the optical module 100 including a driving frequency and amplitude corresponding to the purpose and performance requirement of optical equipment to which the optical module 100 is applied should be easily modified.

Referring to FIG. 1 and FIG. 2, the optical module 100 according to the first exemplary embodiment amplifies displacement according to operation of an actuator 20 and transmits the amplified displacement to the mirror 10 to thereby increase the maximum amplitude, and a natural frequency can be simply controlled by using a deformation member 30 (which can be called as a vibration booster or vibration amplifier) and a hinge member 40. Therefore, the optical module 100 according to the first exemplary embodiment can increase the driving frequency and expand an applicable driving frequency range by increasing the natural frequency.

The optical module 100 includes the mirror 10, a mirror mount 16, the actuator 20, the deformation member 30, the hinge member 40, and a support member 50. In the optical module 100 of the first exemplary embodiment, the hinge member 40 is functioned as the pivot member 15 (refer to FIG. 3) of the mirror 10 which provides an axis of pivoting.

The mirror 10 may form a rectangular-shaped reflective surface 11. The reflective surface 11 may have a predetermined length and a predetermined width. A length direction of the reflective surface 11 matches the longitudinal axis of the line beam LB. The mirror 10 may be disposed in a horizontal direction so as for a length direction of the reflective surface 11 to be parallel with the ground with reference to FIG. 1.

The mirror mount 16 is fixed to the mirror 10 to support the mirror 10, and the hinge member 40 and the support member 50 are provided in a rear side of the mirror mount 16. For convenience, a direction where the reflective surface is disposed is called a front side and the opposite direction is called a rear side with reference to the mirror mount 16.

The actuator 20 is disposed at a distance from one end of the mirror mount 16, and repeats expansion and contraction along the first direction to generate vibration. The deformation member 30 is coupled with the actuator 20, and is deformed according to operation of the actuator 20, thereby having a displacement along the first direction. In addition, the deformation member 30 is coupled with the mirror mount 16, and the displacement along the first direction is changed to a displacement along a second direction and at the same time amplifies the displacement. The deformation member 30 transmits the amplified displacement to the mirror mount 16.

In this case, the first direction may be a direction generally perpendicular to the ground, and the second direction may be a direction that is perpendicular to the first direction and may be parallel with a direction crossing the front side and the rear side of the optical module 100. In embodiments, the second direction may be generally perpendicular to the mirror surface or reflective surface.

The actuator 20 and the deformation member 30 cause the mirror 10 and one end of the mirror mount 16 to be shaken along the second direction. Further, the hinge member 40 is fixed to the mirror mount 16 and the support member 50 therebetween and thus functions as a pivot member of the mirror mount 16 to provide an axis of pivoting. In FIG. 1 and FIG. 2, a vibration direction of the end of the mirror 10 and the rotation direction of the hinge member 40 are marked by arrows.

Figure 5:
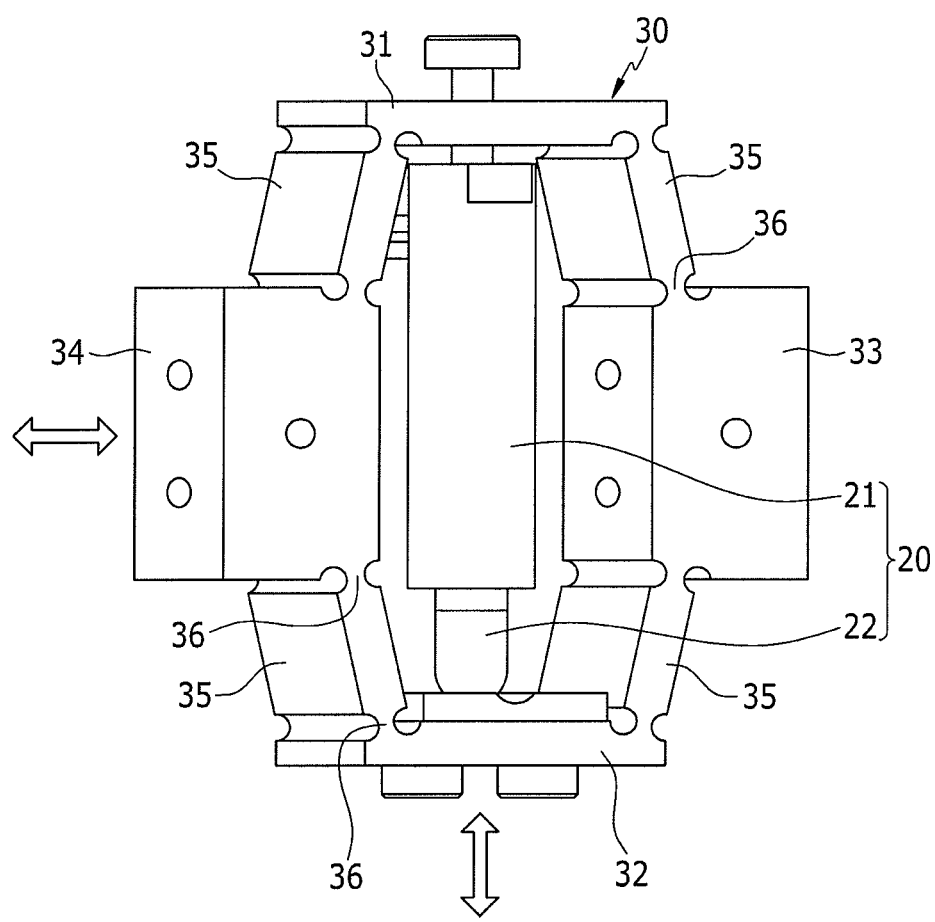
FIG. 5 is a perspective view of an actuator and a deformation member in the optical module of FIG. 1.
Figure 6:
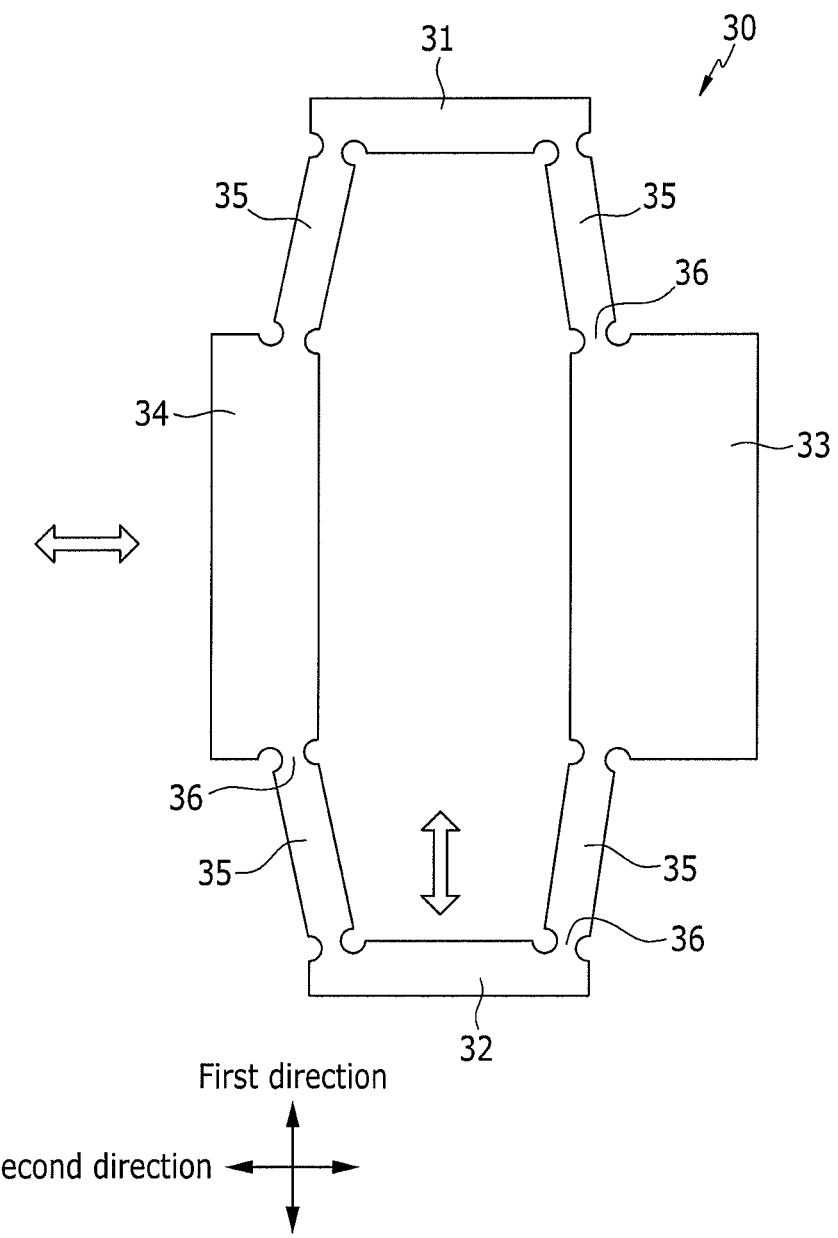
FIG. 6 is a side view of the deformation member of FIG. 5.

FIG. 5 is a perspective view of the actuator and the deformation member of the optical module of FIG. 1, and FIG. 6 is a side view of the deformation member of FIG. 5.

Referring to FIG. 5 and FIG. 6, the deformation member 30 includes a plurality of blocks 31 to 35 respectively connected by flexible joints 36 to form a ring shape. The flexible joint 36 is thinner than each of the blocks 31 to 35, and tends to be bent when external force is applied thereto. In other words, when an external force or a vibration, for example, the vibration from the actuator 20, is applied to the vibration amplifier member 30, the flexible joint 36 is more easily deformed than the blocks 31 to 35. Thus, two blocks disposed, interposing the flexible joint 36 therebetween, have a respective angle that varies depending flexibility of the flexible joint 36.

The deformation member 30 may include at least eight of the blocks 31 to 35 and at least 8 flexible joints 36 that integrally connect every two neighboring blocks. The deformation member 30 may be formed of a metal such as aluminum or stainless steel, and the plurality of blocks 31 to 35 and the plurality of flexible joints 36 are integrally connected such that a single deformation member 30 is formed.

In further detail, the plurality of blocks include first and second blocks 31 and 32 that oppose each other and are arranged along the first direction and third and fourth blocks 33 and 34 that oppose each other and are arranged along the second direction. Further, the plurality of blocks include four connection blocks 35 respectively disposed between the first and third blocks 31 and 33, the third and second blocks 33 and 32, the second and fourth blocks 32 and 34, and the fourth and first blocks 34 and 31.

The third block 33 and the fourth block 34 may be longer than the first block 31 and the second block 32, and the connection block 35 may be shorter than the first block 31 and the second block 32. In addition, lateral side surfaces of each flexible joint 36 have a recessed, semi-circular shape for providing flexibility of the flexible joint 36.

The actuator 20 includes a fixed portion 21 and a working portion or movable portion 22 repeatedly move forward and backward with respect to the fixed portion 21 when the actuator repeats expansion and contraction, and is disposed in parallel with the first direction in the deformation member 30. A first end of the fixed portion 21 is fixed to the first block 31 and a first end of the working portion 22 is fixed to the second block 32. Thus, the second block 32 fixed to the working portion repeats ascending and descending along the first direction by the expansion and contraction of the working portion 22. That is, the second block 32 has a displacement in the first direction due to operation of the actuator 20.

The actuator 20 may be formed as a piezoelectric actuator that can perform precise operation in a narrow displacement section and provide strong power. However, the actuator 20 is not limited to the piezoelectric type actuators, and any type that can be fixed to the deformation member 30 and apply force to one direction (i.e., the first direction) is applicable.

The third block 33 is fixed to the support member 50 and the fourth block 34 is fixed to one end of the mirror mount 16. A fixing bracket 17 (refer to FIG. 1) may be provided between the fourth block 34 and the end of the mirror mount 16 to couple the fourth block 34 and the mirror mount 16.

When the working portion 22 performs expansion, the entire vertical length of the deformation member 30 becomes maximized and the entire horizontal length is minimized. That is, a distance between the third block 33 and the fourth block 34 is minimized. When the working portion 22 performs contraction, the entire vertical length of the deformation member 30 becomes minimized and the entire horizontal length is maximized. That is, a distance between the third block 33 and the fourth block 34 is maximized.

As described, the flexible joint 36 of the deformation member 30 is bent as the second block 32 moves and thus the fourth block 34 moves forward and backward along the second direction. That is, the displacement of the second block 32 along the first direction is changed to the displacement of the fourth block 34 along the second direction and then transmitted to the mirror mount 16.

In this case, the third block 33 and the fourth block 34 are longer than the first block 31 and the second block 32 so that the displacement of the fourth block 34 is greater than the displacement of the second block 32. That is, displacement amplification occurs when the displacement of the second block 32 is changed to the displacement of the fourth block 34. Therefore, the deformation member 30 amplifies the maximum displacement of the working portion 22 and transmits the amplified maximum displacement to the mirror amount 16 such that the maximum amplitude of the mirror 10 can be increased.

In the deformation member 30, the displacement of the fourth block 34 can be simply controlled depending on the length of each of the blocks 31 to 35, the thickness of the flexible joint 36, and the material of the deformation member 30.

Figure 7:
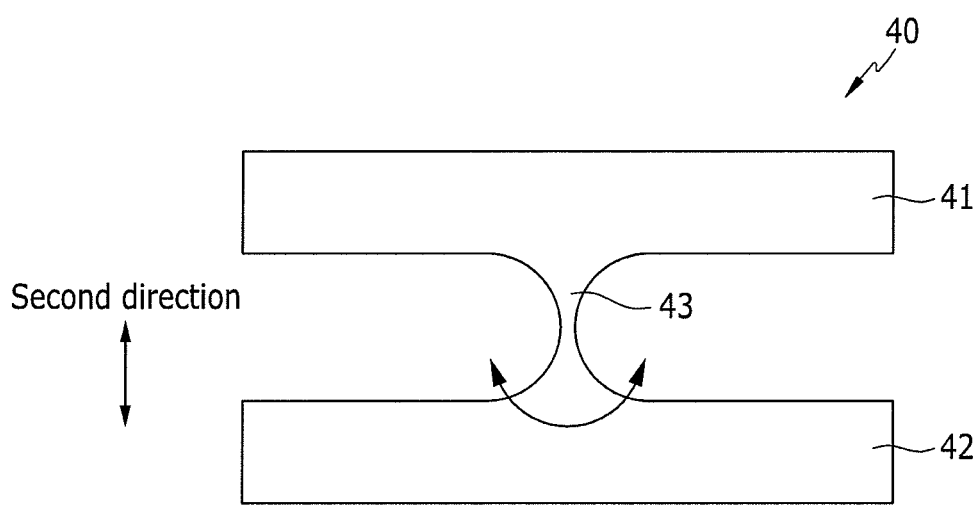
FIG. 7 is a top plan view of a hinge member in the optical module shown in FIG. 1.

FIG. 7 is a top plan view of the hinge member of the optical module of FIG. 1.

Referring to FIG. 1 and FIG. 7, like the deformation member 30, the hinge member 40 includes a flexible joint 43, and has a structure in which deformation can be easily occurred by the flexible joint 43. In further detail, the hinge member 40 is formed of a first part 41 fixed to the support member 50, a second part 42 fixed to the rear side of the mirror mount 16, and the flexible joint 43 integrally connecting the first part 41 and the second part 42. In embodiments, the flexible joint 42 is more easily deformed than the other parts 41 and 42.

The flexible joint 43 is thinner than the first part 41 and the second part 42, and lateral side surfaces of the flexible joint 43 are rounded to have a semi-circular shape for providing flexibility. The first part 41 and the second part 42 may be substantially formed in the shape of a plate, and the flexibility joint 43 is substantially formed in the shape of a bar and may be disposed in parallel with the second direction.

The hinge member 40 may be formed of a metal such as aluminum or stainless steel, and the first part 41, the second part 42, and the flexible joint 43 are integrally connected such that a single hinge member 40 is formed. The hinge member 40 supports rotation of the mirror mount 16 while the first part 41 is fixed to the support member 50 and the second part 42 rotates with respect to the flexible joint 43.

Referring to FIG. 1 and FIG. 2, the support member 50 is coupled to a housing 51 and inclined with a predetermined angle with respect to a height direction (i.e., a direction perpendicular to the ground) such that a tilt angle (i.e., an inclined angle of the reflective surface with respect to the height direction) can be applied to the reflective surface 11.

The above-stated optical module 100 amplifies a small displacement of the actuator 20 using the deformation member 30 so that the maximum amplitude of the mirror 10 can be increased. In addition, the optical module 100 is provided with the hinge member 40 as a pivot member so that other directional work elements of the mirror 10, performing pitching can be restrained with reference to the flexible joint 43.

For example, the optical module 100 can prevent occurrence of yawing so that the lateral ends of the mirror 10 can be prevented from being shaken up and down, and can assure stably operation performance.

In addition, the optical module 100 can easily control a natural frequency depending on the materials of the hinge member 40 and the deformation member 30 and shape characteristics of the hinge member 40 and the deformation member 30 (i.e., the thickness of the flexible joint 43 of the hinge member 40, the entire vertical length of the deformation member 30), and the thickness of the flexible joint 36 of the deformation member 30, size of each of the blocks 31 to 35, etc.). When the natural frequency matches an external frequency (i.e., driving frequency), severe deformation occurs, and therefore the driving frequency of the optical module 100 is selected within a range that is lower than the natural frequency.

Figure 8:
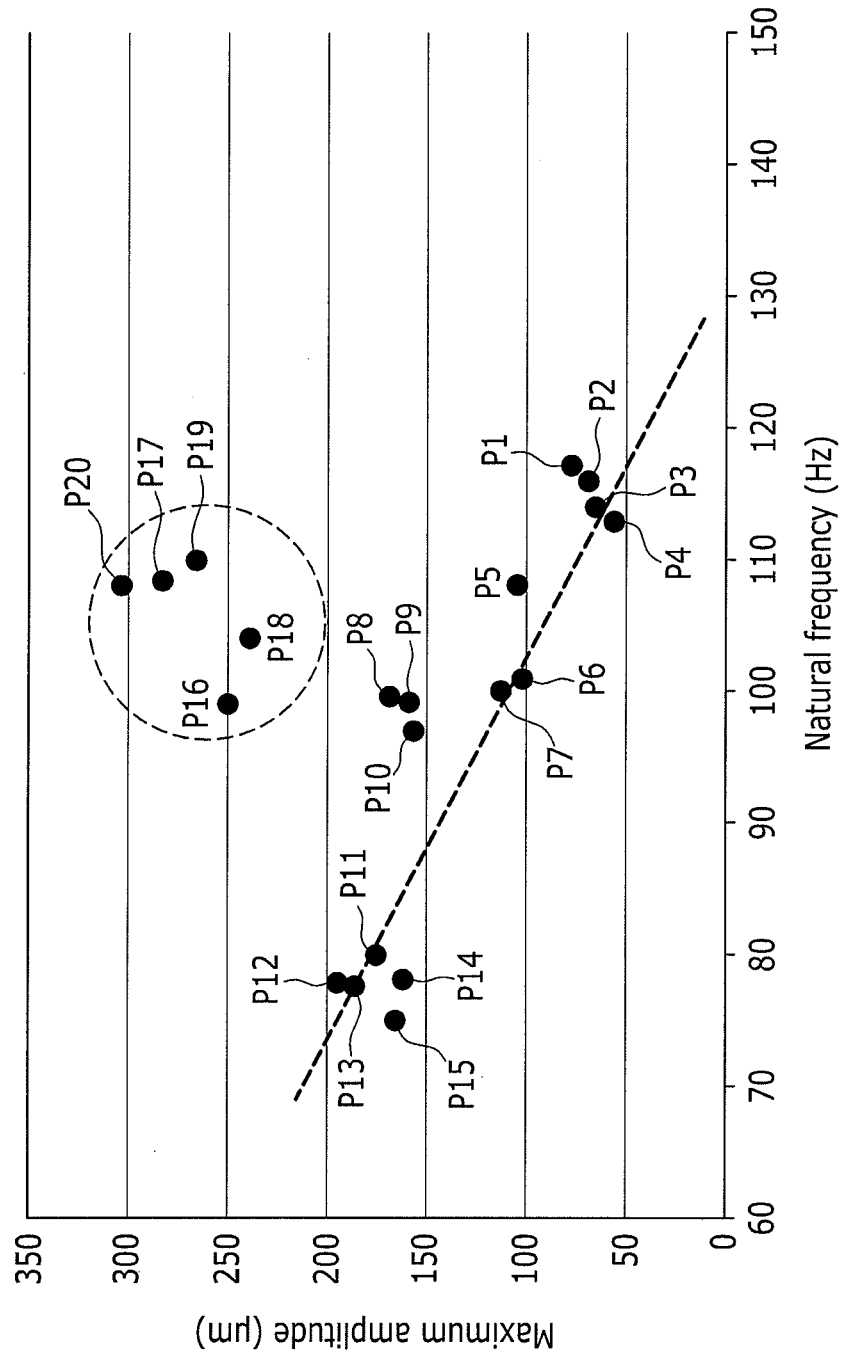
FIG. 8 is a graph illustrating a simulation of natural frequency variation of the optical module.

FIG. 8 is a graph illustrating a simulation of natural frequency variation of the optical module. In the graph, the vertical axis denotes the maximum amplitude under 10 Hz condition. Table 1 shows P1 to P20 of FIG. 8 in detail.

is stainless steel, and in the Table 1, Al and SUS respectively indicate aluminum and stainless steel.

Referring to FIG. 8, in case of P1 to P15, the thickness of the flexible joint 36 of the deformation member 30 is included within a range from about 1 mm to about 3 mm range, and the natural frequency and the amplitude have an inverse proportional relationship. That is, as the thickness of the flexible joint 36 of the deformation member 30 is increased, the natural frequency is increased and the maximum amplitude is decreased. The natural frequency of the optical module 100 can be easily controlled depending on the thickness of the flexible joint 36 of the deformation member 30.

In addition, the natural frequency and the maximum amplitude can be simultaneously increased by changing the length of each of the first block 31 and the second block 32 of the deformation member 30. In the case of P1 to P15, the length of the first block 31 and the length of the second block 32 are respectively 50 mm, and in case of P16 to P20, the length of the first block 31 and the length of the second block 32 are respectively 42 mm. In the case of P16 to P20, the natural frequency and the maximum amplitude can be simultaneously increased compared to the case of P1 to P15.

TABLE 1

| No. | P1 | P2 | P3 | P4 | P5 | P6 | P7 | P8 | P9 | P10 |
|---|---|---|---|---|---|---|---|---|---|---|
| Thickness (mm) of flexible joint of hinge member | 1.0 | 2.2 | 2.2 | 2.0 | 2.0 | 2.2 | 2.0 | 2.2 | 2.0 | 1.0 |
| Thickness (mm) of flexible joint of deformation member | 2.5 | 2.5 | 2.5 | 2.5 | 2.5 | 2.5 | 2.5 | 2.5 | 2.5 | 2.5 |
| The entire vertical length of deformation member | 131 | 131 | 161 | 131 | 161 | 131 | 131 | 161 | 161 | 161 |
| Material of deformation member | SUS | SUS | SUS | SUS | SUS | Al | Al | Al | Al | Al |

| No. | P11 | P12 | P13 | P14 | P15 | P16 | P17 | P18 | P19 | P20 |
|---|---|---|---|---|---|---|---|---|---|---|
| Thickness (mm) of flexible joint of hinge member | 2.2 | 2.2 | 1.0 | 2.0 | 2.0 | 1.0 | 2.0 | 2.0 | 2.2 | 2.2 |
| Thickness (mm) of flexible joint of deformation member | 1.5 | 1.5 | 1.5 | 1.5 | 1.5 | 2.8 | 1.6 | 2.8 | 2.8 | 1.6 |
| The entire vertical length of deformation member | 131 | 131 | 131 | 131 | 131 | 161 | 161 | 161 | 161 | 161 |
| Material of deformation member | Al | SUS | SUS | Al | SUS | Al | SUS | Al | Al | SUS |

In the Table 1, the flexible joints 43 and 36 of the hinge member 40 and the deformation member 30 indicate the minimum thickness of the center of the flexible joints 43 and 36, and the entire vertical length of the deformation member 30 indicates the length measured when the working portion or actuating portion 22 of the actuator 20 performs expansion. In addition, a material of the hinge member 40 in the simulation The optical module 100 of the first exemplary embodiment can realize the natural frequency of 110 Hz, the driving frequency of 50 Hz to 100 Hz, and the maximum amplitude of more than 300 μm with the above-stated structure.

Figure 9:
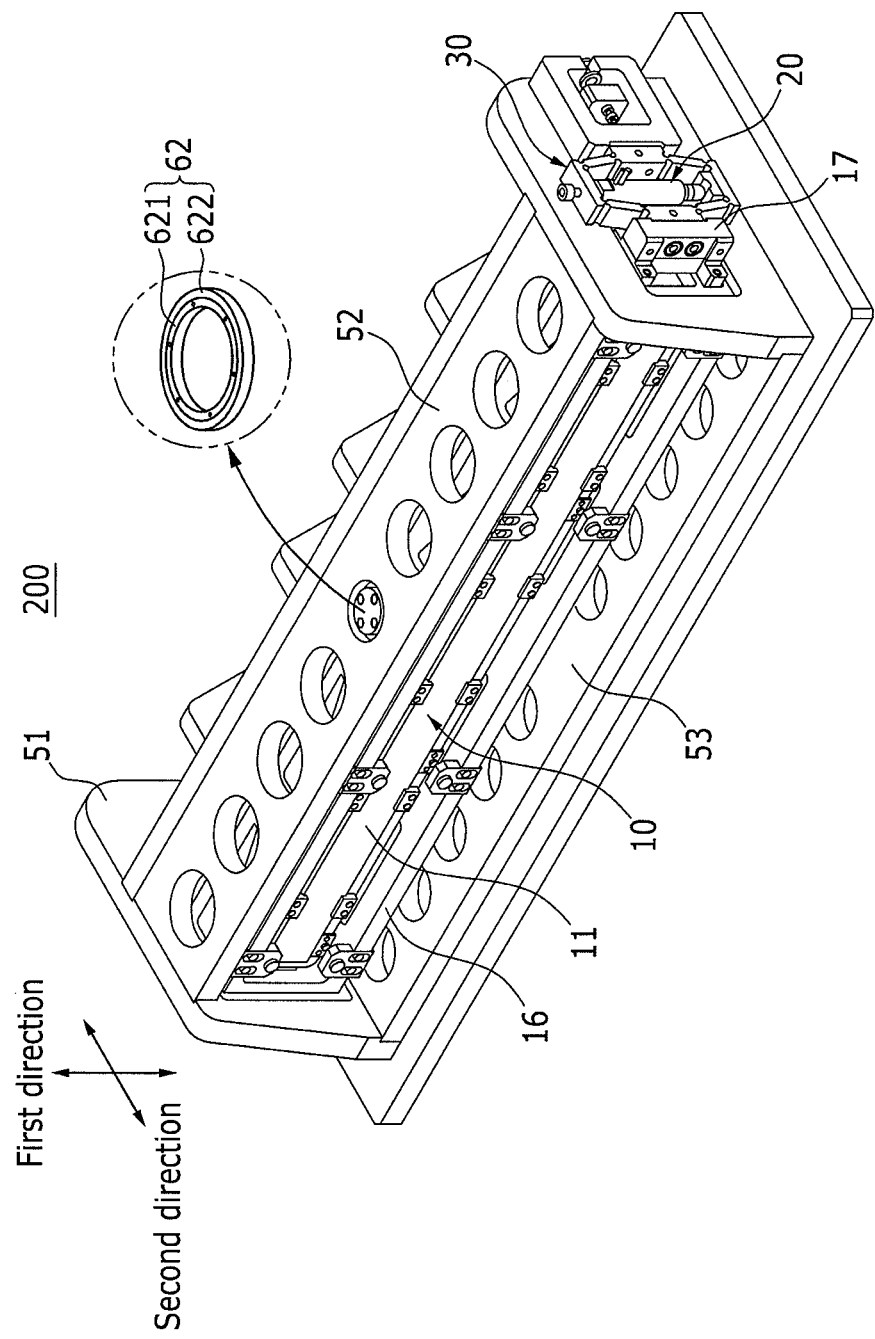
FIG. 9 is a perspective view of an optical module according to a second exemplary embodiment.
Figure 10:
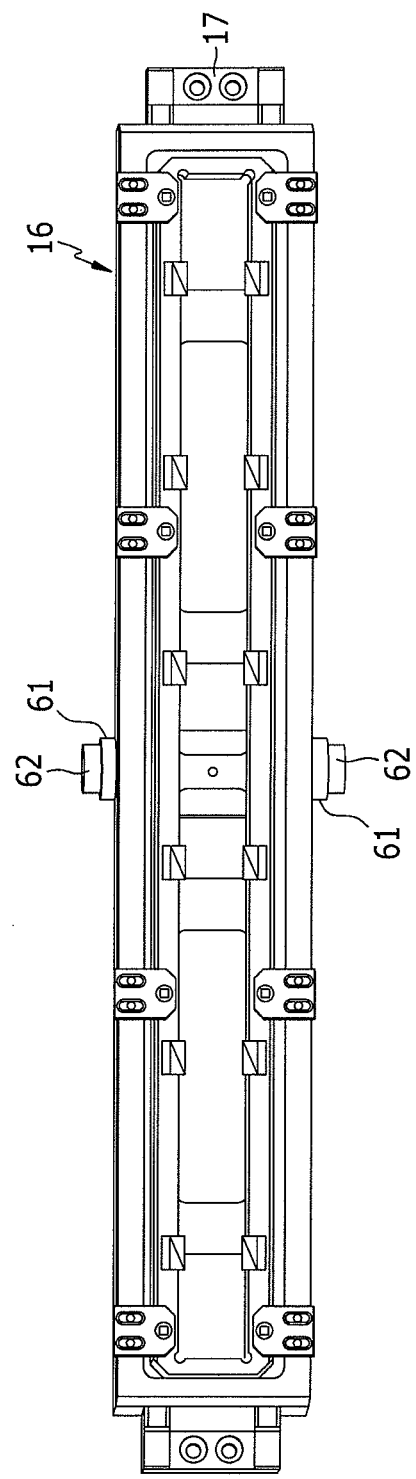
FIG. 10 is a perspective view partially illustrating the optical module of FIG. 9.

FIG. 9 is a perspective view of an optical module according to a second exemplary embodiment and FIG. 10 is a perspective view of a part of the optical module shown in FIG. 9. For the sake of convenience, a mirror is not illustrated in FIG. 10.

Referring to FIG. 9 and FIG. 10, an optical module 200 according to the second exemplary embodiment is the same as the optical module 100 of the first exemplary embodiment, except that, instead of a hinge member, a rotation shaft 61 and a roller bearing 62 are provided as the pivot member 15 (refer to FIG. 2) of the mirror 10. Like reference numerals designate like elements of the first exemplary embodiment.

The rotation shaft 61 may be provided as a pair, respectively provided in a top center and a bottom center of a mirror mount 16. A housing 51 includes a top cover 52 opposing the top surface of the mirror mount 16 and a bottom portion 53 opposing the bottom surface of the mirror mount 16. The roller bearing 62 is provided in each of the top cover 52 and the bottom portion 53 to support rotation of the rotation shaft 61.

The roller bearing 62 may be formed as a cross roller ring. For example, the roller bearing 62 may be provided as an outer-ring rotation type cross roller ring of which an inner race 622 of the roller bearing 62 is fixed to the top cover 52 and the bottom portion 53 and an outer race 622 rotates by being coupled to the rotation shaft 61.

The optical module for laser beam shaking according to the present invention amplifies a displacement according to operation of the actuator and transmits the amplified displacement to the mirror to thereby increase the maximum amplitude of the mirror, and can easily control the natural frequency so that the maximum driving frequency can be increase and at the same time an applicable driving frequency range can be extended.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 100, 200: | optical module |
| 10: | mirror |
| 11: | reflective surface |
| 15: | pivot member |
| 16: | mirror mount |
| 17: | fixing bracket |
| 20: | actuator |
| 30: | deformation member |
| 40: | hinge member |
| 50: | support member |
| 51: | housing |
| 61: | rotation shaft |
| 62: | roller bearing |

What is claimed is:

1. An apparatus for shaking a laser beam, comprising:
   a mirror mount;
   a mirror fixed to the mirror mount and comprising a reflective surface configured to reflect a laser beam;
   an actuator disposed at a distance from an end of the mirror mount and configured to repeat expansion and contraction along a first direction; and
   a deformation member comprising a plurality of blocks connected to each other by flexible joints, and coupled to the actuator and the mirror mount, the deformation member being configured to change a displacement in the first direction caused by the actuator to a displacement in a second direction that crosses the first direction, configured to amplify the changed displacement, and further configured to transmit the amplified displacement to the mirror mount.

2. The apparatus of claim 1, wherein the reflective surface has a rectangular shape and configured to reflect a line beam, and wherein a length direction of the reflective surface matches a longitudinal axis direction of the line beam.

3. The apparatus of claim 2, wherein the first direction is generally perpendicular to the ground and wherein the second direction is generally perpendicular to the reflective surface.

4. The apparatus of claim 1, further comprising:
   a pivot member coupled to the mirror mount and configured to function as a hinge; and a support member coupled to the pivot member.

5. The apparatus of claim 4, wherein the plurality of blocks comprise:
   first and second blocks opposing each other and arranged along the first direction;
   third and fourth blocks opposing each other and arranged along the second direction; and
   a plurality of connection blocks connecting the first to fourth blocks.

6. The apparatus of claim 5, wherein the actuator comprises:
   a fixed portion fixed to the first block; and
   a working portion fixed to the second block and configured to repeatedly move back and forth with respect to the fixed portion.

7. The apparatus of claim 6, wherein the third block is fixed to the support member, the fourth block is fixed to one end of the mirror mount, and wherein the deformation member is configured such that a distance between the fourth block and the third block is changed when the flexible joint is deformed by the movement of the second block.

8. The apparatus of claim 7, wherein the third block and the fourth block are formed larger than the first block and the second block in length so that a displacement of the fourth block becomes greater than a displacement of the second block.

9. The apparatus of claim 8, wherein the pivot member comprises:
   at least one rotation shaft fixed to the mirror mount; and
   at least one roller bearing configured to support the rotation shaft.

10. The apparatus of claim 9, further comprising a housing having a top cover opposing a top surface of the mirror mount and a bottom portion opposing a bottom surface of the mirror mount,
    wherein the at least one rotation shaft comprises a pair of shafts respectively disposed in the top surface and the bottom surface of the mirror mount, and
    wherein the at least one roller bearing comprises bearings provided in the top cover and the bottom portion.

11. The apparatus of claim 10, wherein the roller bearing is formed as an outer-ring rotation type cross roller ring.

12. The apparatus of claim 4, wherein the pivot member is a hinge member, and
    the hinge member comprises
    a first part fixed to the support member,
    a second part fixed to the mirror mount, and
    a flexible joint connecting the first part and the second part.

13. The apparatus of claim 12, wherein the thickness of the flexible joint of the hinge member is smaller than the first part and the second part, and the hinge member is configured such that, when the flexible joint of the hinge member is bent, the second part rotates to support rotation of the mirror mount.

14. The apparatus of claim 12, wherein the hinge member comprises at least one of stainless steel and aluminum, and wherein the flexible joint of the hinge member comprises lateral side surfaces having a semi-circular shape.

15. The apparatus of claim 1, wherein each of the flexible joints has a thickness smaller than that of each of the plurality of blocks.

16. The apparatus of claim 1, wherein the deformation member comprises at least one of stainless steel and aluminum, and wherein each of the flexible joints comprising lateral side surfaces having a semi-circular shape.

\* \* \* \* \*